(12) United States Patent
Carey et al.

(10) Patent No.: US 7,189,589 B2
(45) Date of Patent: Mar. 13, 2007

(54) METHOD OF FABRICATION OF A SUPPORT STRUCTURE FOR A SEMICONDUCTOR DEVICE

(75) Inventors: Glen Phillip Carey, Palo Alto, CA (US); Ian Jenks, Northhamptonshire (GB); Alan Lewis, Sunnyvale, CA (US); René Lujan, Sunnyvale, CA (US); Hailong Zhou, Milpitas, CA (US); Jacy R. Titus, San Jose, CA (US); Gideon W. Yoffe, Fremont, CA (US); Mark A. Emanuel, Morgan Hill, CA (US); Aram Mooradian, Kentfield, CA (US)

(73) Assignee: Novalux, Inc., Sunnyvale, CA (US)

( * ) Notice: Subject to any disclaimer, the term of this patent is extended or adjusted under 35 U.S.C. 154(b) by 0 days.

(21) Appl. No.: 10/735,695

(22) Filed: Dec. 16, 2003

(65) Prior Publication Data
US 2005/0014349 A1 Jan. 20, 2005

Related U.S. Application Data

(60) Provisional application No. 60/434,671, filed on Dec. 20, 2002.

(51) Int. Cl.
*H01L 21/00* (2006.01)
(52) U.S. Cl. .............................. 438/22; 438/29; 438/46
(58) Field of Classification Search ................. 438/22, 438/46, 47, 458, 459, 29
See application file for complete search history.

(56) References Cited

U.S. PATENT DOCUMENTS
3,649,382 A 3/1972 Hawrylo ..................... 148/171
(Continued)

FOREIGN PATENT DOCUMENTS
EP  100 22 879   12/2000

OTHER PUBLICATIONS

B. Corbett, et al.: Low-stress hybridization of emitters, detectors and driver circuitry on a silicon motherboard for optoelectronic interconnect architecture, Materials Science in Semiconductor Processing, vol. 3, No. 5-6, 2000, pp. 449-453.
(Continued)

*Primary Examiner*—Tuan H. Nguyen
(74) *Attorney, Agent, or Firm*—Kenyon & Kenyon LLP

(57) ABSTRACT

A method of fabricating a semiconductor device is described. In this method, a starting substrate of sufficient thickness is selected that has the required defect density levels, which may result in an undesirable doping level. Then a semiconductor layer having a desired doping level is formed on the starting substrate. The resulting semiconductor layer has the required defect density and doping levels for the final product application. After active components, electrical conductors, and any other needed structures are formed on the semiconductor layer, the starting substrate is removed leaving a desired thickness of the semiconductor layer. In a VECSEL application, the active components can be a gain cavity, where the semiconductor layer has the necessary defect density and doping levels to maximize wall plug efficiency (WPE). In one embodiment, the doping of the semiconductor layer is not uniform. For example, a majority of the layer is doped at a low level and the remainder is doped at a much higher level. This can result in improved WPE at particular thicknesses for the higher doped material.

36 Claims, 9 Drawing Sheets

U.S. PATENT DOCUMENTS

| | | | |
|---|---|---|---|
| 5,442,203 A * | 8/1995 | Adomi et al. | 257/97 |
| 6,327,293 B1 | 12/2001 | Salokatve et al. | 372/96 |
| 6,335,547 B1 * | 1/2002 | Yoshinaga et al. | 257/94 |
| 2002/0054618 A1 | 5/2002 | Jiang et al. | 372/50 |
| 2002/0080836 A1 | 6/2002 | Hwang | 372/45 |
| 2002/0177246 A1 | 11/2002 | Hang et al. | 438/22 |
| 2003/0024472 A1 * | 2/2003 | Maruska et al. | 117/97 |

OTHER PUBLICATIONS

R. Pu, et al.: Comparison of techniques for bonding VCSELs directly to Ics, Journal of Optics A: Pure and Applied Optics, vol. 1, No. 2, Mar. 1999, pp. 324-329.

Bernd Jenichen, et al.: Crystal defects in vertical cavity epitaxial structures on GaAs investigated by X-ray methods, Materials Science and Engineering B, Elsevier Sequoia, Lausanne, CH, vol. 28, No. 1/3, Dec. 1, 1994, pp. 520-522.

* cited by examiner

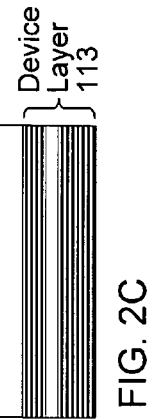
FIG. 2A
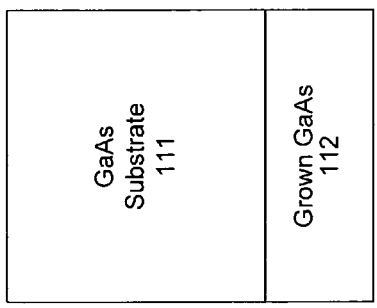
FIG. 2B
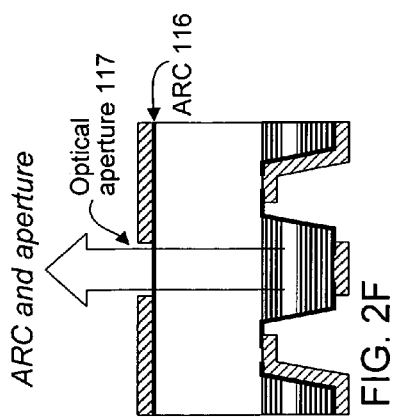
FIG. 2C
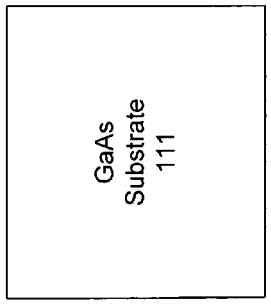
FIG. 2D
NECSEL fabrication
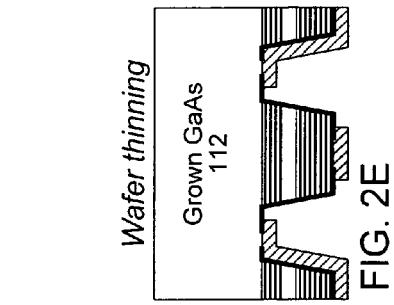
FIG. 2E
Wafer thinning
FIG. 2F
ARC and aperture p-DBR
QWs
n-DBR
Grown semiconductor layer

METHOD OF FABRICATION OF A SUPPORT STRUCTURE FOR A SEMICONDUCTOR DEVICE

BACKGROUND OF THE INVENTION

This application claims priority to U.S. Provisional Application 60/434,671 filed on Dec. 20, 2002.

The present invention pertains to the fabrication of a semiconductor device or an integrated circuit (IC). More particularly, the present invention pertains to the fabrication of a device or IC through the extensive growth of a semiconductor layer of a desired doping profile and defect density on a conventional wafer.

Electronic devices and integrated circuits, and methods for their fabrication, are well known in the art. Typically, the fabrication process starts with a semiconductor substrate with a suitable doping level and defect density. The elements of the device or circuit are then formed on or just below the surface of the substrate through additive processes (such as material deposition using such techniques as chemical vapor deposition (CVD) or sputtering), subtractive processes (such as etching) or processes that modify the properties of the existing material (such as ion implantation or thermal annealing). The processes can be performed selectively using well-known photolithographic techniques to form masking layers on the substrate surface.

One example of an electronic device that can be formed using such processes is a surface emitting laser.

In general, the performance of an electronic device depends not only upon the structure grown or formed on the substrate surface, but also upon the properties of the substrate itself. For example, the doping level in the substrate may affect series resistance and current density distribution if the current flows through the substrate, junction capacitance for junction isolated devices, or latch-up tolerance in devices with parasitic thyristors (such as CMOS ICs). Defect densities are also important, affecting leakage currents and device reliability. In the case of an optical device emitting through the substrate (such as a NECSEL (Novalux® Extended Cavity Surface Emitting Laser)), optical absorption in the substrate is also important.

In the particular case of a NECSEL or bottom emitting VCSEL (Vertical Cavity Surface Emitting Laser), the importance of the substrate properties is as follows. The current flowing to the gain region passes through the substrate. High conductivity is required to keep the series resistance low and prevent too much current crowding at the device perimeter. This can be achieved through the use of a heavily doped, thick substrate. On the other hand, optical loss must be kept low and this means a low doping level and thin substrate. A third requirement arises from the need to maintain device operation within specification over its entire lifetime. A key element in achieving this is to keep the defect density in the substrate low. An acceptable trade-off between these three requirements (low resistance, low optical loss and low defect density) is difficult to achieve in commercially available substrate materials.

In view of this, there is a need for an improved method of manufacture of an electronic device or integrated circuit that eliminates the need for the starting substrate to meet all three of the requirements noted above.

SUMMARY OF THE INVENTION

According to an embodiment of the present invention, a method of fabricating a semiconductor device is described.

In this method, a starting substrate of sufficient thickness is selected that has the required (usually low) defect density. Normal methods of substrate growth, such as the VGF (vertical gradient freeze) technique, can only achieve low defect densities if the doping level is high (greater than $1 \times 10^{18}$ cm$^{-3}$ in GaAs, for example). Such high doping levels are usually undesirable for bottom emitting VCSELs or NECSELs as described above. However, according to the present invention, a highly doped low defect density substrate can be used as the starting material. A semiconductor layer is epitaxially grown on top of the low defect density starting material. The grown material can be any material that can be grown with high crystal quality on the starting material. Typically it will be the same as the starting material (for example, GaAs on GaAs) but other material combinations are possible (for example AlGaAsP on GaAs where the AlGaAsP composition is adjusted to give a close lattice match with the underlying GaAs). Any suitable epitaxial growth technique can be used for the semiconductor layer (including MOCVD, MBE, etc). If the growth conditions are correctly chosen, the crystal quality (including defect density) will match or be better than that of the underlying material.

The active components, electrical contacts etc. are formed on top of the grown semiconductor layer using well-established wafer-scale fabrication techniques. At an appropriate stage during this fabrication, the original substrate material is removed from the whole wafer by any suitable technique (mechanical polishing, chemical etching, chemical-mechanical polishing (CMP), chemical or physical plasma etching etc.) leaving only a sufficient thickness of the grown semiconductor layer to provide mechanical support for the active components once they are separated into individual die. Typically, the thinning of the wafer will be performed at or close to the end of the active device fabrication sequence so that the thicker starting material is present to provide mechanical support during most or all of the wafer fabrication sequence.

In one embodiment of the invention, the doping of the grown semiconductor layer is uniform and can be selected for optimum device performance. Low defect density is achieved as described above and is fully decoupled from the doping density. In a second embodiment, the doping density is not uniform. For example, it might be kept very low (less than $1 \times 10^{16}$ cm$^{-3}$) through most of the grown layer to minimize optical absorption and increased only in a thin region close to the active devices to provide good electrical conduction.

BRIEF DESCRIPTION OF THE DRAWINGS

FIGS. 2A–2F are diagrams presenting a fabrication process for a semiconductor device according to an embodiment of the present invention.

DETAILED DESCRIPTION

Figure 1A:
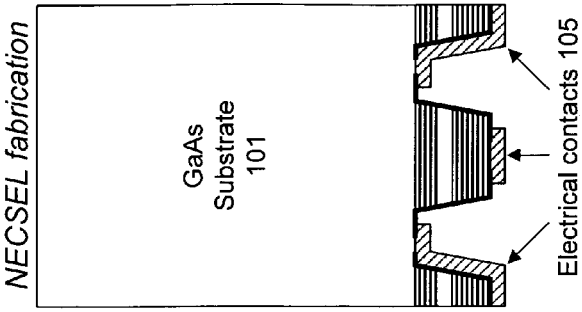
FIGS. 1A–1E are diagrams presenting a fabrication process for a NECSEL semiconductor device as is known in the art.
Figure 1B:
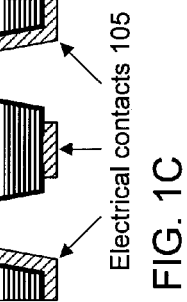
Figure 1C:
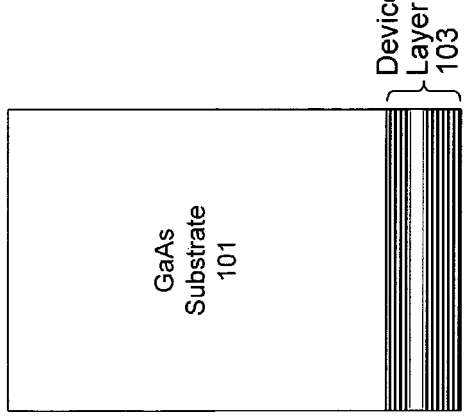
Figure 1D:
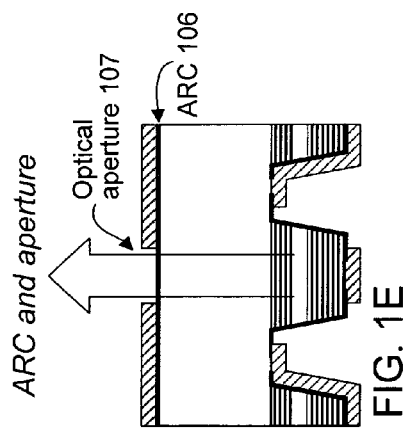
Figure 1E:
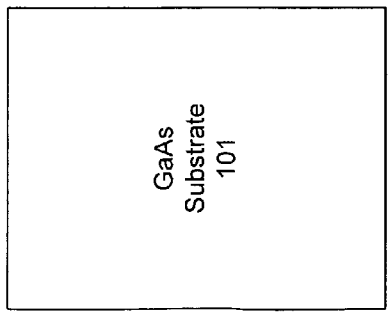

Referring to FIGS. 1A through 1E, an example of a semiconductor fabrication process is presented for an optical device, in this case a NECSEL, as it is known in the art. In this example, the starting substrate 101 is a low-doped 4-inch GaAs wafer. In the second diagram, the device layer, 103, is grown epitaxially on one surface of the wafer. In the case of a NECSEL, the device layer includes distributed Bragg reflectors (DBRs) and quantum wells to provide optical gain. In the third diagram, the NECSEL device is further fabricated, and electrical contacts 105 are added. In the fourth diagram the substrate is thinned to the desired final thickness and polished to give the necessary optical quality finish. In the fifth diagram, an anti-reflective coating (ARC), 106, and an optical aperture, 107, are formed on the polished surface to complete the NECSEL die. In operation, light is generated in the device and is emitted as shown by the large arrow.

Referring to FIGS. 2A through 2F, an example of a semiconductor fabrication process for an optical device is presented according to an embodiment of the present invention. In this embodiment, wafer 111 is selected to meet the defect density requirements of the optical device without regard to doping density. Suitable GaAs wafers with low defect densities (etch-pit density, or EPD, values of less than 500 cm$^{-2}$) are readily available from manufacturers but typically have doping levels of approximately $1\times10^{18}$ cm$^{-3}$ or higher. Such material is commonly grown using a well-known VGF (vertical gradient freeze) technique. The high doping level typically renders them unsuitable for NECSELs. A GaAs layer, 112, is then grown on the starting substrate. The thickness of this layer is selected to provide sufficient mechanical support for the final devices while the doping level (uniform or non-uniform) is selected for optimum laser performance. With proper selection of growth conditions, the defect density in the grown layer will be similar to or better than that of the starting substrate. Once the high-quality support layer, 112, is grown, the rest of the device fabrication may proceed as shown in FIG. 1. The device layer 113 is grown, and the NECSEL device is fabricated with electrical contacts 115. A key element of the present invention, however, is that the wafer thinning step now removes all of the starting substrate 111. In this way, when the device is completed, with anti-reflective coating (ARC), 116, and an optical aperture, 117, none of the original substrate remains. It is thus possible to combine arbitrary doping profiles (including very low dopant density) with the low defect density normally requiring high dopant density.

According to a first embodiment of the present invention, the support layer 112 has a uniform doping level of between $5\times10^{16}$ cm$^{-3}$ and $5\times10^{17}$ cm$^{-3}$ and a thickness of about 100 µm.

According to a second embodiment of the present invention, the support layer 112 is doped very lightly through most of the material (for example, less than $1\times10^{16}$ cm$^{-3}$) in order to minimize optical absorption, while a thin (e.g., 2 to 20 µm thick) layer of more heavily doped material (for example, $5\times10^{17}$ cm$^{-3}$ and $5\times10^{18}$ cm$^{-3}$) is formed immediately adjacent to the device layer to provide electrical conduction. Such a tailored doping profile is readily obtained, for example, by adjusting dopant source flow rates during epitaxial growth by metal organic chemical vapor deposition (MOCVD).

Figure 3A:
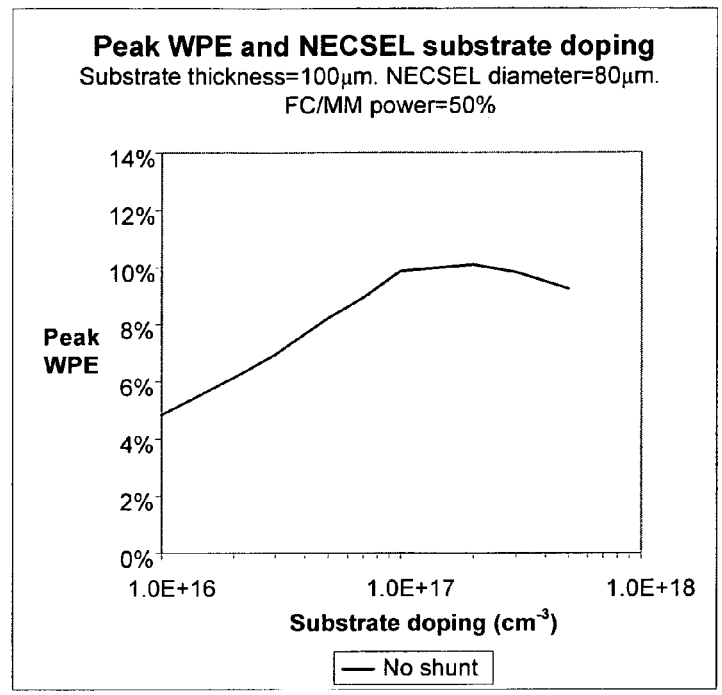
FIGS. 3A–B are graphs showing wall plug efficiency (WPE) for NECSEL devices incorporating the semiconductor layer of FIG. 2 built according to embodiments of the present invention.
Figure 3B:
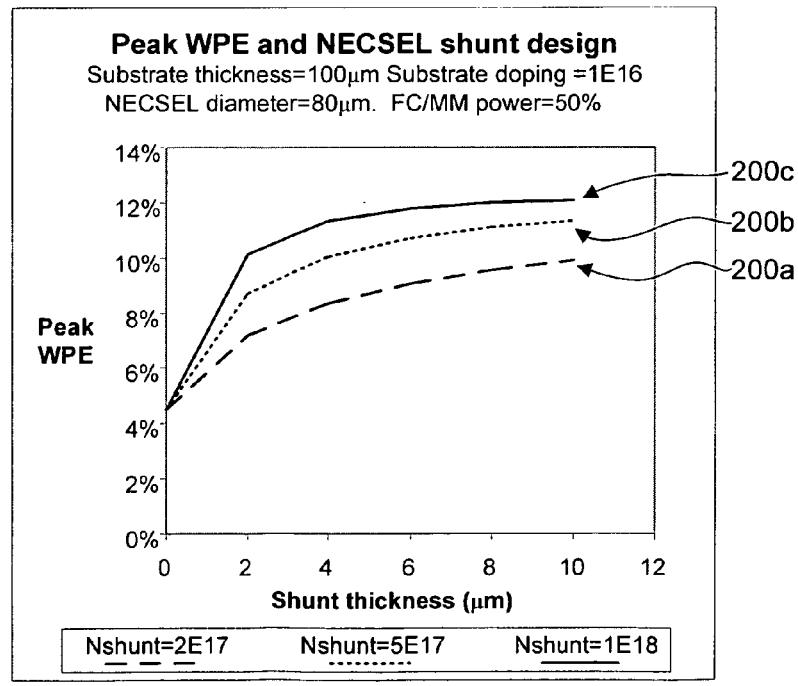

The effect of tailoring the doping profile in this way can be described in more detail with respect to FIGS. 3A and 3B. The figures show the modeled wall plug efficiency (WPE) for various NECSEL designs. The wall plug efficiency is the ratio of the optical power emitted by the NECSEL to the input electrical power and is an important performance value for diode lasers. In general, high wall plug efficiency is desired. FIG. 3A illustrates what can be achieved with a uniform substrate doping by changing that doping level. For the sake of this example, a NECSEL diameter of 80 µm and a substrate thickness of 100 µm are assumed. The peak WPE is about 10% and is achieved with a uniform substrate doping of about $2\times10^{17}$ cm$^{-2}$. From the point of view of maximizing WPE, this substrate doping represents the best compromise between low series resistance and low optical absorption.

FIG. 3B, however, shows that better performance can be achieved by using a tailored substrate doping profile. In this case, most of the grown support substrate is doped to $1\times10^{16}$ cm$^{-3}$, but a thin shunt layer (having a thickness between 0 and 10 µm) of more heavily doped material is added adjacent to the device layer as described above. Three n-type doping levels are considered in the shunt layer: $2\times10^{17}$ cm$^{-3}$, $5\times10^{17}$ cm$^{-3}$, and $1\times10^{18}$ cm$^{-3}$. The three curves show the variation in WPE as the shunt layer thickness is adjusted: curve 200a shows simulated results for a shunt doping of $2\times10^{17}$ cm$^{-3}$, curve 200b shows results for a shunt doping of $5\times10^{17}$ cm$^{-3}$, and curve 200c shows results for a shunt doping of $1\times10^{18}$ cm$^{-3}$. It is clear that with the two higher shunt doping levels, higher WPE values can be achieved with the tailored substrate doping design than can be achieved using a uniformly doped substrate. For example, with a shunt doping of $1\times10^{18}$ cm$^{-3}$ and a shunt thickness of about 8 µm, the peak WPE is about 12%.

The calculations discussed above show that embodiments of the present invention offer not only improved reliability (through lower substrate defect density) but also better device performance. The calculations are based on one example of a NECSEL design. However, tailoring the substrate doping profile can be applied to other NECSEL and optical device designs with different device diameters, substrate thicknesses, or device layer designs. The specific optimum doping profile (shunt thickness and doping level) will in general be different for different optical device designs.

Figure 4:
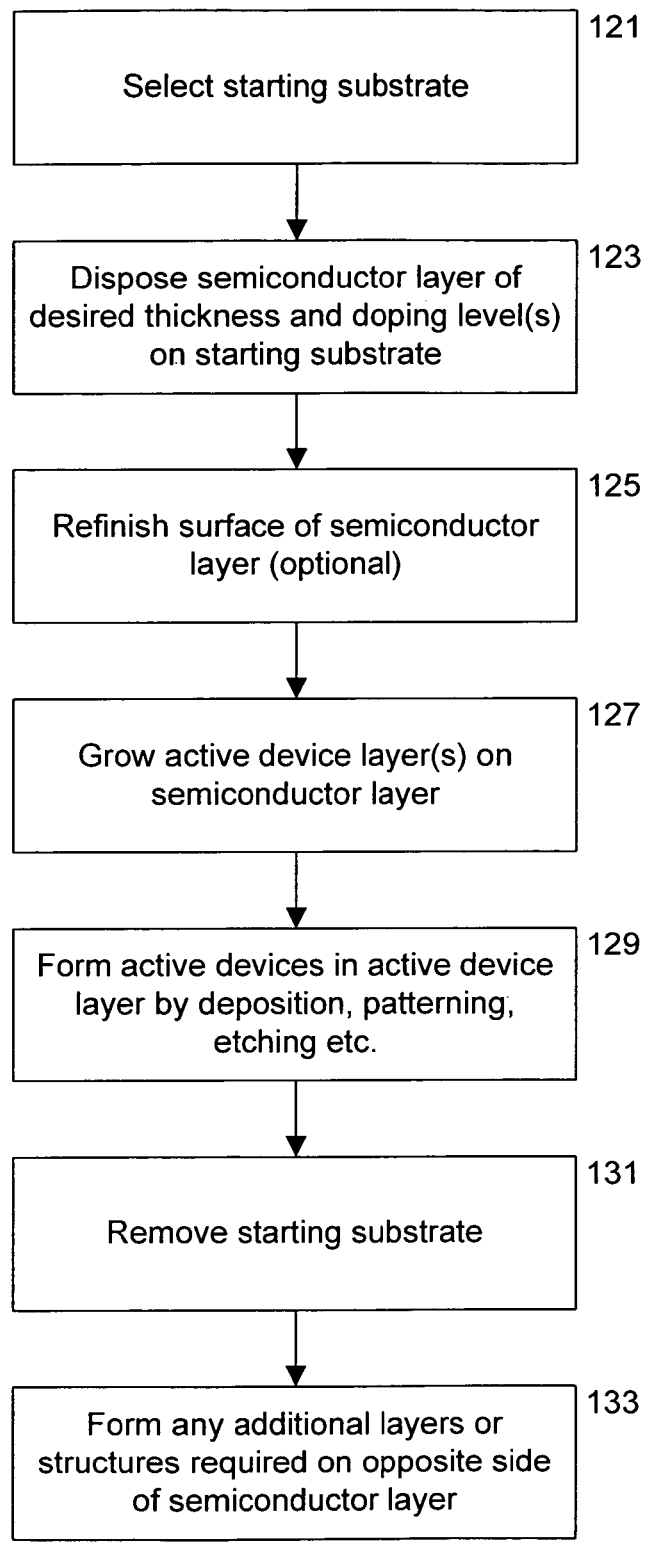
FIG. 4 is a flow chart of a semiconductor fabrication process according to an embodiment of the present invention.
Figure 5A:
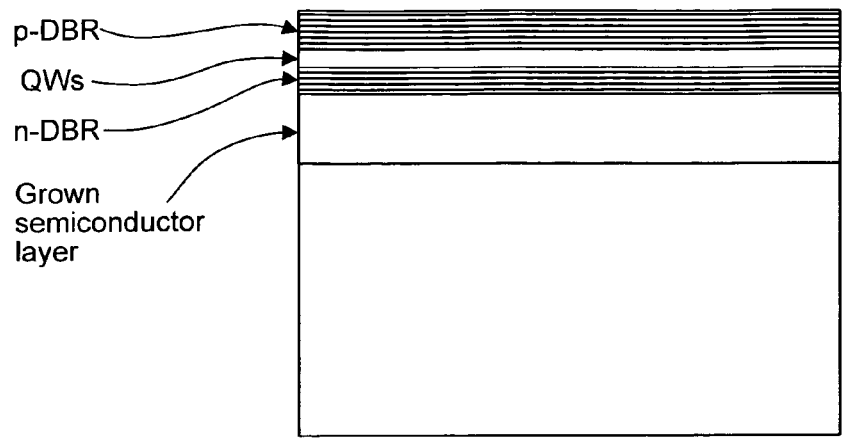
FIGS. 5A–5J depict a fabrication process for an optical device using the semiconductor layer of FIG. 2.
Figure 5B:
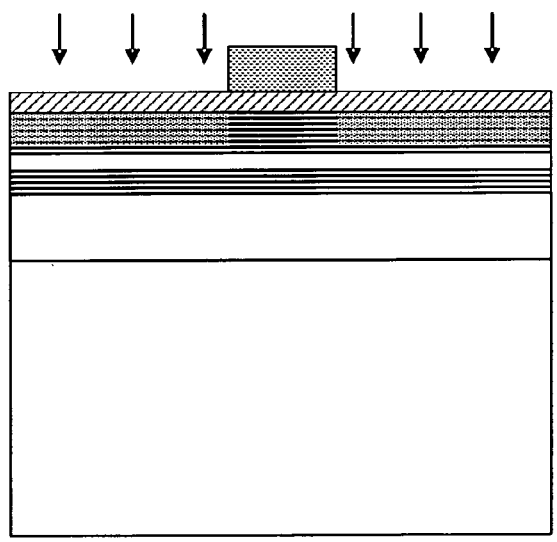
Figure 5C:
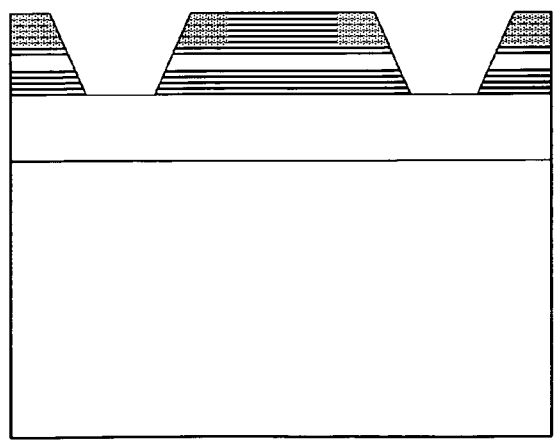
Figure 5D:
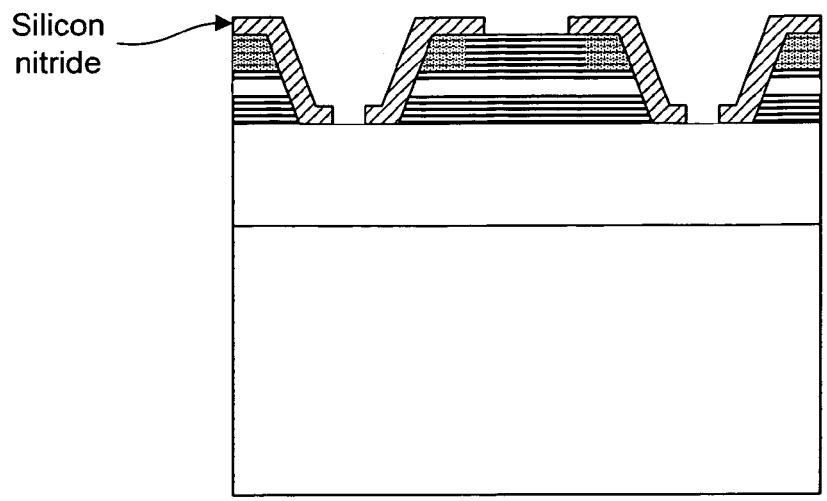
Figure 5E:
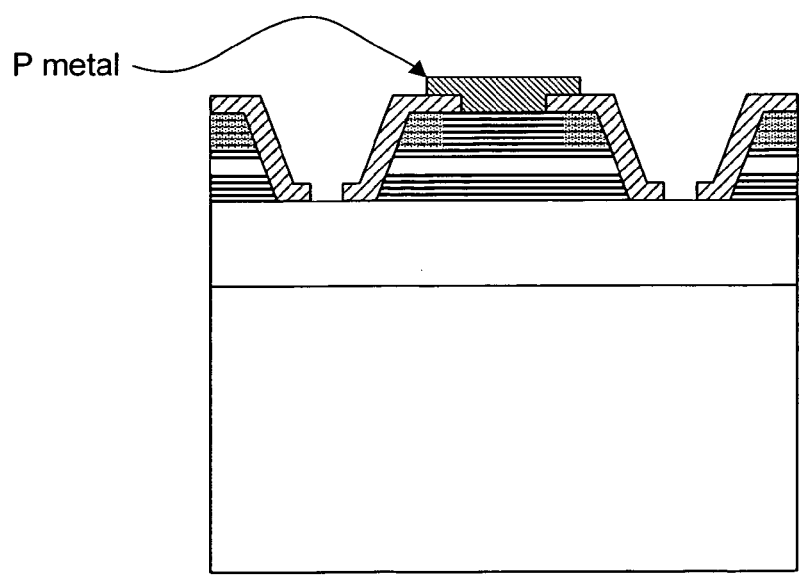
Figure 5F:
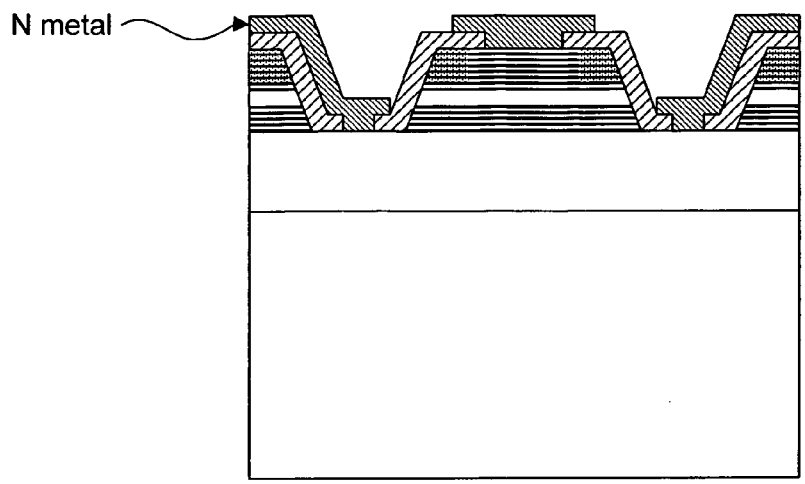
Figure 5G:
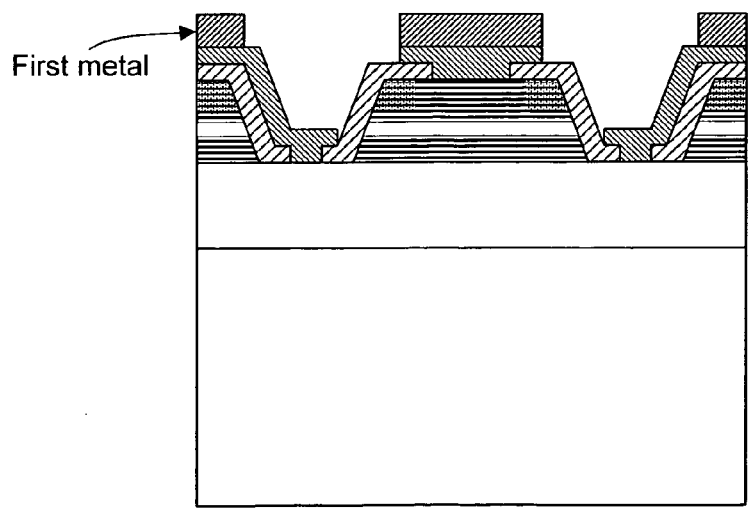
Figure 5H:
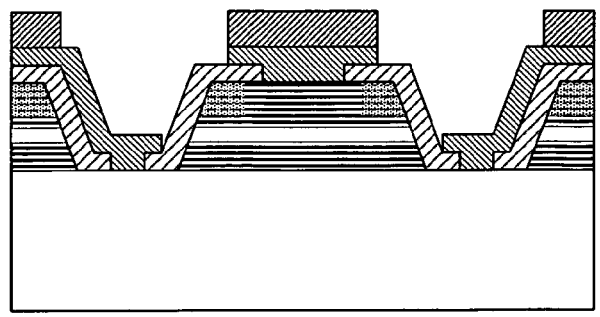
Figure 5I:
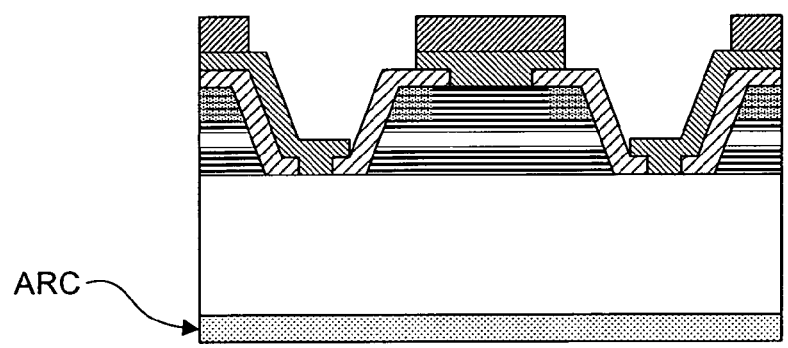
Figure 5J:
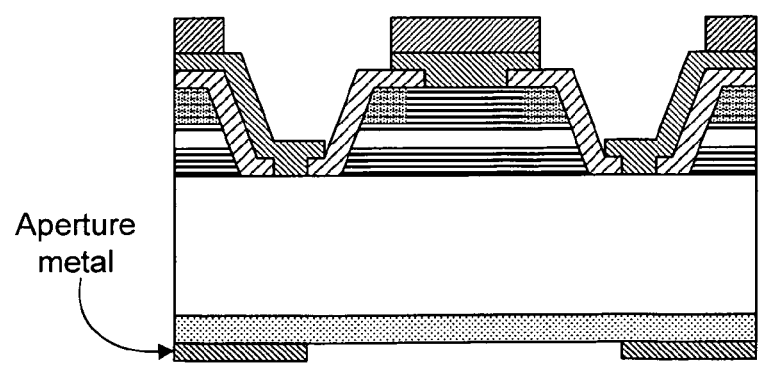

An example of an overall process sequence for fabricating a semiconductor device according to an embodiment of the present invention is summarized with reference to FIG. 4. In block 121 of the flow diagram a starting substrate is selected. As discussed above, the starting substrate may be selected on the basis of defect density alone without regard for doping level or even dopant type. In block 123 a semiconductor layer having a desired thickness is disposed onto the starting substrate with a desired doping profile. In the examples discussed above, the semiconductor layer might have a uniform doping of between $5\times10^{16}$ cm$^{-3}$ and $5\times10^{17}$ cm$^{-3}$ or may have a more complex doping profile with two or more doping levels at different depths and selected gradients between those levels. The material of the semiconductor layer should either be the same as the starting substrate (for example, GaAs grown on GaAs) or be of a composition such that it can be grown epitaxially with good crystal quality (for example, AlGaAsP grown on GaAs where the AlGaAsP composition is selected to give a good lattice match to the GaAs). In block 125, optional refinishing of the wafer surface can be performed in preparation for growth of the active device layer. In block 127, the active layer(s) required for the intended devices are grown. For example, for a NECSEL appropriate distributed Bragg reflectors (DBRs) and quantum wells are grown. In block 129 the processing required to form the active devices is carried out using known techniques such as dielectric and metal deposition, photolithography, etching, implantation and annealing. In block 131 the original starting substrate is completely removed using a technique such as, for example, mechanical or chemical-mechanical polishing or chemical etching. Finally in block 133, any additional layers or structures required on the opposite side of the substrate are formed, again using known techniques. The devices on the wafer are then complete. The wafer can be separated into individual die and those dice mounted and electrical contacts made using well-known methods.

Several techniques for removing the starting substrate material can be applied in order to implement embodiments of the current invention. In one embodiment, mechanical or chemical-mechanical polishing is used to remove the material. In the embodiment described above, the grown material and starting substrate material are very similar (both are GaAs and they differ only in the doping level). It is thus difficult to determine exactly when the original starting material is fully removed. This is overcome by growing more material in layer 112 than is needed in the final device, and removing some of the grown layer (for example, 10 to 20 μm) with the substrate. The polishing process can be timed or the wafer thickness measured in order to ensure full removal of the substrate.

An alternative embodiment uses a chemical etch to remove the starting substrate. A suitable etch stop is grown on the starting substrate before growth of the support layer 112. Examples of suitable etch-stop layers include AlGaAs and GaAsP. In the case of an AlGaAs etch-stop, the GaAs substrate could be removed with, for example, a citric acid/hydrogen peroxide/water mixture that etches GaAs preferentially over AlGaAs. With a GaAsP etch-stop, an example of a suitable etch is ammonium hydroxide/hydrogen peroxide/water. Once the starting substrate is removed, the etch stop layer can either be left in place or removed by a further chemical etch.

It is also possible to combine the substrate removal processes discussed above. For example, polishing could be used to remove most of the starting GaAs with chemical etching used to remove the remaining material and finish accurately on the etch-stop.

Embodiments of the present invention are based on epitaxial growth of single crystal material on a semiconductor substrate. The various embodiments can be realized using any suitable method for epitaxial growth, including, but not limited to, metal organic chemical vapor deposition (MOCVD), molecular beam epitaxy (MBE), vapor phase epitaxy (VPE) or liquid phase epitaxy (LPE).

An example of the fabrication of a semiconductor device using the present invention is described with reference to FIGS. 5A through 5J. The first figure shows a cross section of the wafer after epitaxial growth, including the support semiconductor layer and the device active layer. The fabrication process combines known semiconductor processing steps as follows to form the NECSEL die:

a. Creation of fiducial marks used to align the masks defining the patterns for subsequent layers (steps 1–3).
   Step 1. Starting wafer after after epitaxial growth (see FIG. 5A).
   Step 2. Photolith 1: Fiducial mask (for subsequent alignment).
   Step 3. Fiducial metal deposition and lift-off (not shown).
b. Current confinement (steps 4–8). This is achieved using a proton implant that reduces the conductivity of the p-DBR outside the required gain aperture by about a factor of about 10,000. The NECSEL will still function without this implant, but current flows outside the gain aperture, reducing wall-plug efficiency. A sacrificial nitride layer covers the wafer during this entire process. The high-energy implant easily penetrates through this layer, and removal of the layer ensures that any contaminants from the implantation or masking steps do not remain on the wafer.
   Step 4. Nitride deposition.
   Step 5. Photolith 2: Resist mask for implant.
   Step 6. Proton implant (see FIG. 5B).
   Step 7. Resist strip.
   Step 8. Nitride removal.
c. Separation of the epitaxial layer into isolated mesas (steps 9–11). This not only allows electrical contact to the substrate layer but also alleviates the strain inherent in the epitaxial layer, flattening the final die for improved die attach, more consistent performance and better reliability.
   Step 9. Photolith 3:Mesa mask.
   Step 10. Etch mesas (see FIG. 5C).
   Step 11. Resist strip.
d. Wafer passivation (steps 12–15). A nitride layer passivates the wafer surface and mesa sidewalls; vias are opened in the nitride for electrical contacts.
   Step 12. Nitride deposition.
   Step 13. Photolith 4: nitride.
   Step 14. Nitride etch (see FIG. 5D).
   Step 15. Resist strip.
e. Creation of electrical contacts to the anode and cathode of the laser diode (steps 16–26). The contacts are formed on the same side of the die to enable a robust and reliable die attach process once wafer processing is complete.
   Step 16. Photolith 5: P-metal lift-off mask.
   Step 17. P-metal stack deposition.
   Step 18. P-metal lift-off (see FIG. 5E).
   Step 19. P-metal sinter.
   Step 20. Photolith 6: N-metal lift-off mask.
   Step 21. N-metal stack deposition.
   Step 22. N-metal lift-off (see FIG. 5F).
   Step 23. N-metal sinter.
   Step 24. Photolith 7: First metal lift-off mask.
   Step 25. First metal deposition.
   Step 26. First metal lift-off (see FIG. 5G).
f. On-wafer test (step 27). Full laser operation can be checked at this early stage in manufacturing.
   Step 27. On-wafer test.
g. Wafer thinning to remove the starting substrate material. (steps 28–29).
   Step 28. Wafer mount (epi side down) on sapphire substrate.
   Step 29. Wafer thinning (lap and polish) (see FIG. 5H).
h. Formation of an anti-reflecting layer on the output surface, essential for good mode control and smooth L-I characteristics in the final product (step 30).

Step 30. Anti-reflection coating (ARC) deposition (see FIG. 5I).
i. Formation of an optical aperture on the output surface to improve mode control (steps 31–33). The aperture is defined using a metal layer.
Step 31. Photolith 8: Aperature metal lift-off mask.
Step 32. Aperture metal deposition.
Step 33. Aperture metal lift-off (see FIG. 5J).
j. Finishing (steps 34-35).
Step 34. De-mount from sapphire substrate.
Step 35. Scribe and break.

Figure 6A:
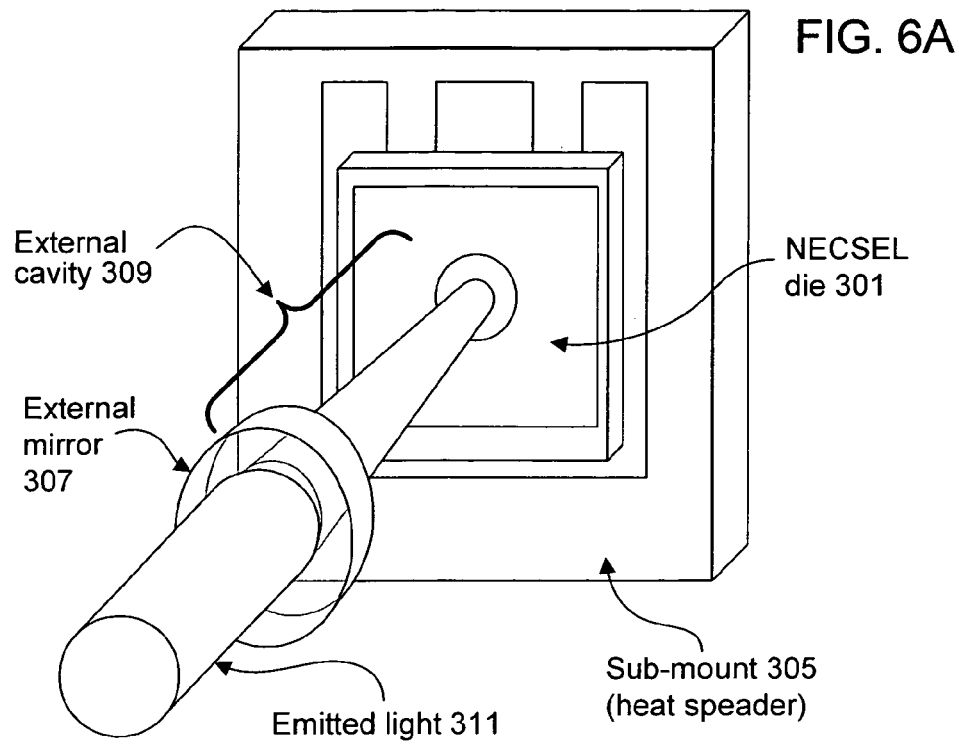
FIGS. 6A and 6B depict a completed optical semiconductor device (e.g., a NECSEL), built according to an embodiment of the present invention.
Figure 6B:
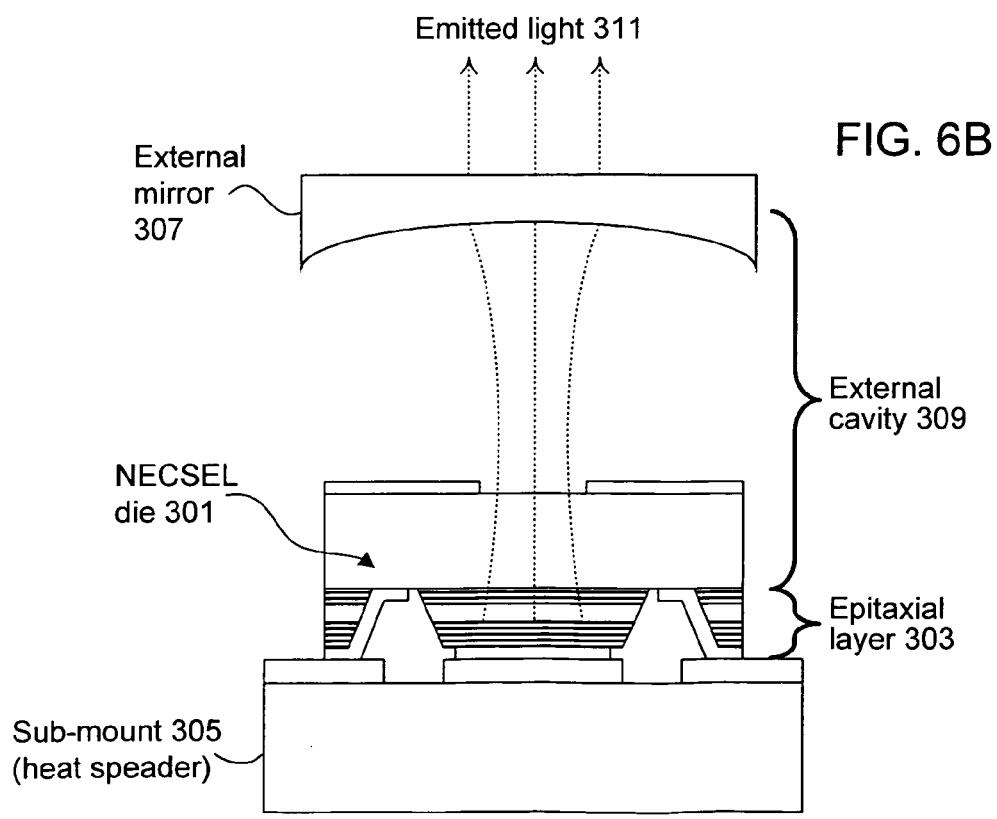

The structure of the completed NECSEL is described with reference to FIG. 6. The NECSEL die, 301, including epitaxial layer 303 is fabricated as described above. The die is soldered to the sub-mount/heat spreader 305 using known techniques. The laser is completed using an external mirror 307 to form an external cavity 309. This structure is described in the art (U.S. Pat. Nos. 6,243,407 and 6,404,797, the disclosure of which are hereby incorporated by reference in their entirety).

Although the NECSEL fabrication sequence is used here for illustration, the present invention can also be used to build other types of semiconductor devices.

What is claimed is:

1. A method of fabricating a semiconductor device comprising:
selecting a starting semiconductor substrate having a first defect density and a first doping level;
forming a semiconductor layer on said starting semiconductor substrate to have a second defect density that is equal to or less than the first defect density, the semiconductor layer being doped during formation to have a second doping level that is less than the first doping level at a first surface closest to the starting semiconductor substrate;
forming active components on a second surface of said semiconductor layer, opposite to the first surface; and
removing said starting semiconductor substrate.

2. The method of claim 1 further comprising:
controlling a doping level for said semiconductor layer during formation.

3. The method of claim 2 wherein the doping level is controlled to uniformly dope the semiconductor layer at the second doping level.

4. The method of claim 2 wherein the doping level is controlled to dope a majority of the thickness of said semiconductor layer at the second doping level and dope a region of said semiconductor layer adjacent to the second surface at a third, higher doping level.

5. The method of claim 1 wherein said starting semiconductor substrate and said semiconductor layer are made from GaAs.

6. The method of claim 1 wherein said starting semiconductor substrate is made from GaAs and said semiconductor layer is made from epitaxial growth of a single crystal material.

7. The method of claim 6 wherein said semiconductor layer is made from AlGaAsP.

8. The method of claim 1 wherein said starting semiconductor substrate has a low defect density.

9. The method of claim 8 further comprising:
controlling a doping level for said semiconductor layer during formation.

10. The method of claim 9 wherein the semiconductor layer is uniformly doped at the second doping level.

11. The method of claim 8 wherein said starting semiconductor substrate and said semiconductor layer are made from GaAs.

12. The method of claim 8 wherein said starting semiconductor substrate is made from GaAs and said semiconductor layer is made from epitaxial growth of a single crystal material.

13. The method of claim 12 wherein said semiconductor layer is made from AlGaAsP.

14. The method of claim 1 wherein said forming active components includes forming an optical gain cavity on the second surface of said semiconductor layer, the optical gain cavity arranged to emit light through the semiconductor layer.

15. The method of claim 14 further comprising:
controlling a doping level for said semiconductor layer during formation.

16. The method of claim 15 wherein the doping level is controlled to uniformly dope the semiconductor layer at the second doping level.

17. The method of claim 14 wherein said starting semiconductor substrate and said semiconductor layer are made from GaAs.

18. The method of claim 14 wherein said starting semiconductor substrate is made from GaAs and said semiconductor layer is made from epitaxial growth of a single crystal material.

19. The method of claim 18 wherein said semiconductor layer is made from AlGaAsP.

20. The method of claim 14, further comprising:
forming an optical aperture on the first surface of said semiconductor layer after removing said starting semiconductor substrate; and
disposing an external mirror/lens relative to the first surface of said semiconductor layer to create an extended optical cavity.

21. The method of claim 20 further comprising:
controlling a doping level for said semiconductor layer during formation.

22. The method of claim 21 wherein the semiconductor layer is uniformly doped at the second doping level.

23. The method of claim 22 wherein the second doping level is between $5 \times 10^{16}$ cm$^{-3}$ and $5 \times 10^{17}$ cm$^{-3}$.

24. The method of claim 21 wherein the doping level is controlled to dope a majority of the thickness of said semiconductor layer at the second doping level, and dope a region of said semiconductor layer adjacent to the second surface at a third, higher doping level.

25. The method of claim 20 wherein said starting semiconductor substrate and said semiconductor layer are made from GaAs.

26. The method of claim 20 wherein said starting semiconductor substrate is made from GaAs and said semiconductor layer is are made from epitaxial growth of a single crystal material.

27. The method of claim 26 wherein said semiconductor layer is made from AlGaAsP.

28. The method of claim 20 further comprising:
forming an anti-reflecting layer on the first surface of said semiconductor layer after removing said starting semiconductor substrate, the optical aperture to be formed on the anti-reflecting layer.

29. The method of claim 14 wherein said forming active components further includes:
forming a first electrical contact on the optical gain cavity; and forming a second electrical contact to electrically contact the second surface of the semiconductor substrate, the first and second electrical contacts being formed on a same side of the semiconductor layer.

30. The method of claim 29 further comprising:
controlling a doping level for said semiconductor layer during formation, the doping level being controlled to dope a majority of the thickness of said semiconductor layer at the second doping level and dope a region of said semiconductor layer adjacent to the second surface at a third, higher doping level.

31. The method of claim 14 further comprising:
controlling a doping level for said semiconductor layer during formation, the doping level being controlled to dope a majority of the thickness of said semiconductor layer at the second doping level and dope a region of said semiconductor layer adjacent to the second surface at a third, higher doping level.

32. The method of claim 1 further comprising:
forming an etch-stop layer on the starting semiconductor substrate prior to forming the semiconductor layer, wherein the etch-stop layer is composed of a different material than the starting semiconductor substrate and the semiconductor layer.

33. The method of claim 32 further comprising:
removing the etch-stop layer after removing the starting semiconductor substrate.

34. The method of claim 1 further comprising:
forming a first electrical contact over the active components; and
forming a second electrical contact to electrically contact the second surface of the semiconductor substrate, the first and second electrical contacts being formed on a same side of the semiconductor layer.

35. The method of claim 34 further comprising:
controlling a doping level for said semiconductor layer during formation, the doping level being controlled to uniformly dope the semiconductor layer at the second doping level.

36. The method of claim 34 further comprising:
controlling a doping level for said semiconductor layer during formation, the doping level being controlled to dope a majority of the thickness of said semiconductor layer at the second doping level and dope a region of said semiconductor layer adjacent to the second surface at a third, higher doping level.

* * * * *